United States Patent [19]

Fischer et al.

[11] Patent Number: 4,527,121
[45] Date of Patent: Jul. 2, 1985

[54] SHORT-CIRCUIT-PROTECTED EVALUATION CIRCUIT OF HIGH STABILITY FOR VARIABLE INDUCTANCE TRANSDUCERS

[75] Inventors: Werner Fischer, Ditzingen; Ulrich Flaig, Markgröningen; Gerhard Hettich, Esslingen; Johannes Locher, Stuttgart, all of Fed. Rep. of Germany

[73] Assignee: Robert Bosch GmbH, Stuttgart, Fed. Rep. of Germany

[21] Appl. No.: 377,023

[22] Filed: May 11, 1982

[30] Foreign Application Priority Data

May 14, 1981 [DE] Fed. Rep. of Germany ....... 3119162

[51] Int. Cl.³ .................. G01B 7/14; G01N 27/00
[52] U.S. Cl. ........................ 324/207; 331/65; 307/308; 328/5; 324/225
[58] Field of Search ............ 324/207, 208, 225; 331/65; 307/308; 328/5

[56] References Cited

U.S. PATENT DOCUMENTS 3,932,774  1/1976  Buck ........................... 307/308
4,241,317  12/1980  Breitling ........................ 331/65

Primary Examiner—Gerard R. Strecker
Assistant Examiner—Walter E. Snow
Attorney, Agent, or Firm—Frishauf, Holtz, Goodman & Woodward

[57] ABSTRACT

The inductance of a variable inductor is put in series with a resistor to provide a delay circuit at the output of an amplifying path and the delayed voltage is fed-back to produce square waves having a period representative of the induct. The amplifying path includes a first amplifier and a final stage that includes a transistor. A second transistor is connected to a voltage supply line feeding the final stage and the delay network and is also connected to the final stage in such a way that the second transistor conducts when the first transistor of the final stage is blocked and so that the second transistor is automatically blocked when the output of the final stage is at a low potential. The base of the second transistor is connected through a resistance to a battery voltage line at a somewhat higher potential than that of the voltage supply line for the final stage. It is useful to provide an additional amplifier to operate the second transistor with its input coming from the feed back line supplied by the variable inductor and its network resistor, preferably through a low-pass filter. For adjustments that may be necessary when the inductor of a system is replaced, the characteristic curve of the evaluation circuit can be additively shifted by interposing a resistance-capacitance delay followed by an amplifying comparator in the amplifying path, preferably between the preliminary amplifier and the final stage.

10 Claims, 5 Drawing Figures

SHORT-CIRCUIT-PROTECTED EVALUATION CIRCUIT OF HIGH STABILITY FOR VARIABLE INDUCTANCE TRANSDUCERS This invention concerns an electric circuit for continuously indicating the value of an inductance which is caused to vary over a range of value. It is particularly intended for use with variable inductors of the short-circuiting ring type that are used as inductive tranducers for measuring a mechanical displacement, such as are used in motor vehicles of advanced design. A wide variety of evaluation circuits for variable inductances is known. For example the inductance can be combined with a capacitor into a resonant circuit connected to an amplifier to provide a structure capable of producing oscillation, the frequency of which can then be measured with a frequency counter. Such circuits have the disadvantage that they are very sensitive to temperature changes and the output signal also changes with variations of the properties of the amplifier or of the capacitor. Furthermore, these circuits are sensitive to short-circuit, because in the case of a short-circuit either the amplifier or the coil of the inductor may be damaged or destroyed.

The invention

It is an object of the present invention to provide an evaluation circuit for a variable inductance which is not vulnerable with regard to short-circuits and is substantially insensitive to temperature changes and to fluctuations in the supply voltage.

Briefly, a resistance is connected in series with the variable inductance, between the inductor and a voltage supply line which is preferably a line at a stabilized voltage, for constituting a delay network at the output of a final stage that follows a preliminary amplifier. The delay voltage produced by the network is fed back to the input of the preliminary amplifier for timing the cycle period of oscillations of the circuit which produce an output signal at the final stage. Significantly, the final stage contains a first transistor and there is also provided a second transistor connected to the voltage supply line and to the final stage in such a way that the second transistor conducts when the first transistor is blocked and so that the second transistor is automatically blocked when the output of the final stage is at a low potential.

The circuit of the invention has the advantage that it shows only small temperature effects and is to a great extent independent of variations in supply voltage. A further advantage is that the circuit delivers a symmetrical output signal, which is particularly important when the inductance has a strong dependence upon the frequency components of the current flowing through it. Furthermore, the circuit of the invention is resistent to the effects of short-circuits to ground.

It is particularly useful to include a second amplifier that operates on the above mentioned second transistor and has its input connected to the feedback line leading to the preliminary amplifier. The second amplifier improves the immunity to short-circuits when the leads from the circuit to the inductive transducer which contains the variable inductance are short-circuited to the battery line.

In order to provide reliable turning off in the case of short-circuit of the transistor switch to ground, it is desirable to limit the voltage at the input of the preliminary amplifier, by means of a diode, to the stabilized supply voltage and also to connect a diode from the other input from the other input of the preliminary amplifier directly to the feedback line. In the case of short-circuit, the result is then obtained that the transistor switching to ground is blocked so that it is not destroyed by short-circuit currents and the variable inductor is likewise not damaged.

In order to suppress voltage peaks at the output of the evaluation circuit it is convenient to connect a diode between the stabilized supply voltage and the signal output. In that way the maximum value output signal is limited approximately at the level of the stabilized supply voltage. Further, it is desirable when the additional amplifier is used to connect it through a low pass filter with the feedback line. That prevents transient peaks that may appear on the transducer leads from causing the short-circuit prevention circuits to respond. It is further desirable to have one of the inputs of the preliminary amplifier controlable through a diode by the additional amplifier. By this arrangement the circuit is made particularly stable with respect to temperature.

In order to produce an additive shift of the characteristic curve of the evaluation circuit, it is useful to interpose, in the amplification path, an additional delay network. The additional delay network is preferably composed of an amplifying comparator that follows a resistance-capacitance network. A particularly simple delay function is thereby provided. Preferably the second delay network is interposed between the preliminary amplifier and the final stage. At this location there is already a suitable signal configuration available, so that the additional delay network can be very simply calculated to provide the desired amount of shift of the characteristic of the circuit, and it is also simple in operation.

THE DRAWINGS

The invention is further described by way of four illustrative examples with reference to the annexed drawings, in which.

DESCRIPTION OF THE ILLUSTRATED EMBODIMENTS

Figure 1:
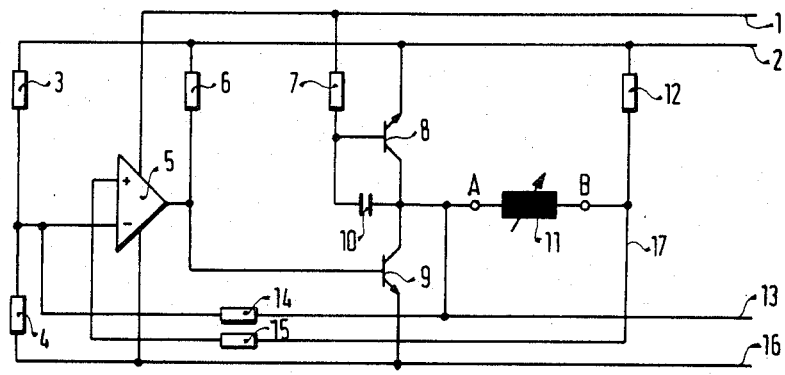
FIG. 1 is a circuit diagram of a first embodiment of the invention.

The line at the top of the diagram given in FIG. 1 is the battery voltage line 1 on which is available, for example, the voltage of a motor vehicle storage battery. The stabilized voltage line 2 supplies a stabilized voltage that is lower than the voltage on the battery voltage line 1, by a difference that is not greater than the maximum emitter to base voltage of the transistor 8.

A resistor 3 is connected to the voltage line 2 and is connected in series with the resistor 4 which leads to the ground line 16. The voltage supply of an amplifier 5 connected as a comparator is also connected to the battery voltage line 1 and the ground line 16. The voltage tap at the junction of the resistors 3 and 4 is connected to the inverting input of the amplifier 5. The output of the amplifier 5 is connected on the one hand through a resistor 6 with the voltage line 2 and on the other hand to the base of a transistor 9. The emitter of the transistor 9 is connected to the ground line 16, while its collector is connected to the collector of the transistor 8. The base of the transistor 8 is connected through a resistor 7 with the battery voltage line 1. A capacitor 10 is connected between the base and the collector of the transistor 8. The emitter of the transistor 8 is connected to the voltage line 2. The collectors of the transistors 8 and 9 are connected on one hand to the terminal A and on the other hand to an output line 13 and over a resistor 14 to the inverting input of the amplifier 5. A variable inductance 11 is connected between the terminals A and B. A resistor 12 is connected to the terminal B at one end and to the voltage line at the other. The feedback line 17 is connected to the terminal B and leads through a resistor 15 to the non-inverting input of the amplifier 5.

When the transistor 9 becomes conducting under control of the amplifier 5, the potential of the terminal A is pulled down towards ground. The stabilized voltage of the voltage line 2 appears across the resistor 12 and the inductance 11. The current through the resistor 12 and the inductance 11 now rises with the time constant determined by the delay circuit formed of this resistor and inductance and the voltage at the terminal B sinks correspondingly, hence also the voltage at the noninverting input of the amplifier 5. If the voltage applied to the noninverting input falls lower than the voltage at the inverting input of the amplifier 5, the amplifier 5 switches over and blocks the transistor 9. The voltage at the inverting input of the amplifier 5 is determined essentially by the resistors 3 and 4, the voltage at the voltage line 2 and the voltage at the terminal A, while the voltage at the terminal A is constituted essentially by the saturation voltage of the transistor 9. On the basis of the momentary current flow through the inductance 11 the voltage at the terminal A would tend to rise indefinitely. The transistor A, however, now becomes conducting and limits the voltage at the terminal A to the value of the voltage in the voltage line 2 less the saturation voltage of the transistor 8. The resistor 7 assures that the transistor 8 is fully switched, while the capacitor 10 serves to accelerate the switching operation.

A voltage close to zero now lies across the delay circuit composed of the resistor 12 and the inductance 11. The current through the delay circuit drops with the same time constant with which the voltage rises at the terminal B until the voltage at the noninverting input again exceeds the voltage at the inverting input of the amplifier 5. The transistor 9 becomes conducting again while the transistor 8 is blocked with acceleration by the capacitor 10. Statically the base of the transistor 8 is held by the diode formed by the base and collector of this transistor at a low potential so that only an inverse current produced by the resistor 7 and the low inverse amplification flows through the transistor 8.

The switching thresholds in this circuit are dependent only on the offset voltage and the offset currents of the amplifier 5 which is constituted as a differential amplifier, by the saturation voltages of the transistors 8 and 9 and by the values of the resistors 3, 4 and 14 and are established relative to the stabilized voltage in the voltage line 2. Since the saturation voltages of the transistors 8 and 9 are relatively small and have no great dependence upon temperature, the circuit is highly stable with respect to temperature, particularly if resistors of small temperature coefficient are used.

The inductance 11 is generally not integrated with the circuit, but rather is provided in a transducer, for example, a short-circuiting ring transducer in which the position of the ring provided in response to mechanical action varies the inductance. This requires the variable inductance device to be located at a mechanically determined site and connected to the rest of the circuit of FIG. 1 by connection leads that are attached to the terminals A and B. If now a short-circuit appears that connects either the terminal A or the terminal B to the ground line 16, the transistor 8 will become blocked as in normal operation and the maximum permissible short-circuit current will be limited and determined by the magnitude of the resistor 12.

Figure 2:
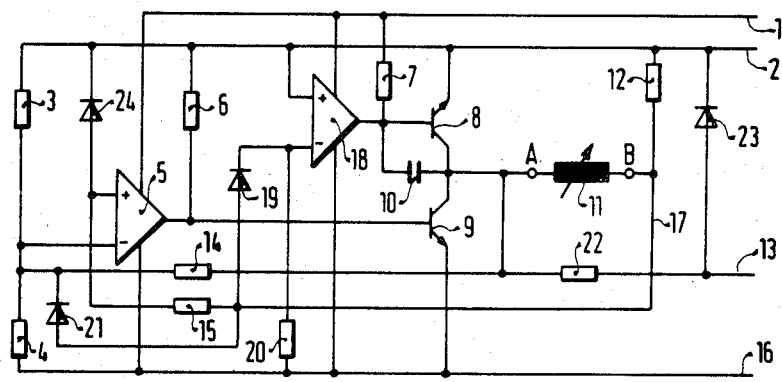
FIG. 2 is a circuit diagram of a second and short-circuitproof embodiment.

The embodiment illustrated in FIG. 2 has improved properties under short-circuit conditions. The battery voltage line 1 again feeds the amplifier 5 and the resistor 7 which leads to the base of the transistor 8. It also supplied operating voltage to an amplifier 18. The voltage line 2 which provides the stabilized voltage is connected over resist rs 3 and 4 to the ground line 16. The tap at the connection between the resistors 3 and 4 leads to the inverting input of the amplifier 5. The output of the amplifier 5 is connected through the resistors 6 with the voltage line 2. The output of the amplifier 5 also is connected to the base of the transistor 9. The emitter of the transistor 9 is connected with the ground line 16, while the collectors of the transistors 8 and 9 are together connected to the terminal A. A resistor 22 connects the terminal A with the output 13 of the circuit and a resistor 14 connects the terminal A with the inverting input of the amplifier 5. A diode 23 is connected between the output 13 and the voltage line 2. The capacitor 10 again is connected between the base and the collector of the transistor 8, while the emitter of the transistor 8 is connected with the voltage line 2. The variable inductance 11 is again connected between the terminal A and B. The resistance 12 connects the terminal B with the voltage line 2, while the feed back line 10 connects the terminal B to the resister 15, the other end of which is connected to the noninverting input of the amplifier 5.

A diode 24 is connected between the noninverting input of the amplifier 5 and the voltage line 2. A diode 21 connects the terminal B with the inverting input of the amplifier 5. A diode 19 is connected between the terminal B and the inverting input of an amplifier 18, where there is also connected a resistor 20 the other end of which is connected to the ground line. The noninverting input of the amplifier 18 is connected to the voltage line 2. The output of the amplifier 18 is connected to the base of the transistor 8.

If either the terminal A or the terminal B is grounded, the short-circuit current is again limited by the resistor 12. If now for any reason the terminal A or B has the battery voltage, the voltage at the noninverting input of the amplifier 5 is limited by the diode 24 to the stabilized voltage less the diode voltage of the diode 24, and the voltage at the inverting input of the amplifier 5 is brought through the diode 21 to a value in the neighborhood of the battery voltage. The amplifier 5 switches over and blocks the transistor 9. The inverting input of the amplifier 18 is also brought to a voltage near the battery voltage by means of the diode 19. Since the stabilized voltage at the voltage line 2 is smaller than the battery voltage, the amplifier 18 also switches over, so that the transistor 8 is likewise blocked. A short-circuit current can again flow only through the resistance 12 and the current is produced only by the voltage difference between the battery voltage and the stabilized voltage. In order to prevent a rise of the output voltage at the output 13 above the value of the stabilized voltage in the voltage line 2, the diode 23 is provided which brings down the ultimately occurring higher voltages to the stabilized voltage, while the current is limited by the resistor 22.

Figure 3:
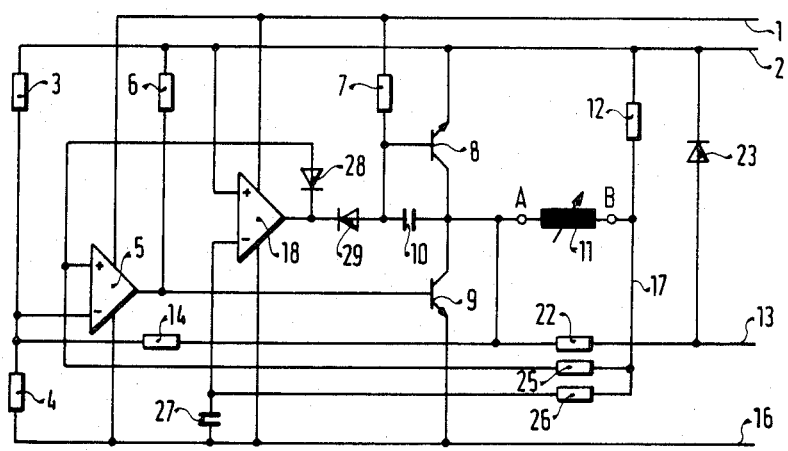
FIG. 3 is a circuit diagram of a third embodiment that is both short-circuitproof and temperature stable.

The embodiment shown in FIG. 3 has a more favorable temperature characteristic and is also insensitive to transient peaks on the transducer leads between the terminals A and B. The supply conductors for the amplifiers 5 and 18 are connected to the battery voltage line 1, from which the resistor 7 provides a path to the base of the transistor 8. The resistor 3 is connected to the voltage line 2 at one end and at the other end through the resistor 4 to the ground line 16. At the tap between the resistors 3 and 4 a connection is made to the inverting input of the amplifier 5. The output of the amplifier 5 is connected through the resist r 6 with the voltage line 2. There is also a connection from the output of the amplifier 5 to the base of the transistor 9. The emitter of the transistor 9 is connected to the ground line 16, while the collectors of both transistors 8 and 9 are connected together and connected to the terminal A. A connection is provided from the terminal A over the resistor 14 to the inverting input of the amplifier 5 and another over the resistor 22 to the output 13. The diode 23 is connected between the output 13 and the voltage line 2.

The capacitor 10 is again provided between the base and collector of the transistor 8, while the resistance 7 connects the base of the transistor 8 with the battery voltage line 1.

The variable inductance 11 is connected between the terminals A and B. A resistor 12 is connected between the terminal B and the voltage line 2 and a resistance 25 between that terminal and the noninverting input of the amplifier 5. A resistor 26 is connected between the terminal B and the inverting input of the amplifier 18, to which a capacitor 27 is connected that has its other connection leading to the ground line 16. The noninverting input of the amplifier 18 is connected to the voltage line 2. The output of the amplifier 18 is connected through a diode 29 in its blocking direction to the base of the transistor 8. Further a dial is interposed between the noninverting input of the amplifier 5 and output of the amplifier 18.

The operation of this circuit corresponds likewise to that of the circuit of FIG. 1. Even when there is a short-circuit to ground at the terminals A and B the events previously described take place. If a voltage higher than the stabilized voltage reaches the terminals A and B, however, thus for example the battery voltage, the inverting input of the amplifier 18 becomes more positive than the noninverting input and the amplifier blocks the transistor 8. Because of the filter effect of the resistor 26 and the capacitor 27 the input of the amplifier 18 is insensitive with respect to short duration voltage pulses at the terminals A and B, that for example can be induced in the leads to the inductance.

By the switching over of the amplifier 18 at its output, towards ground, the noninverting input of the amplifier 5 is also pulled down through the diode 28, so that the transistor 9 is also blocked by means of the amplifier 5. The behavior of this circuit with respect to temperature is better than that of the circuit of FIG. 2, because here in normal working operation no diode distorts the signal voltage. In the circuit of FIG. 2 the diode 21 is responsible for a partial deviation of the operating point at the inverting input of the amplifier 5, so that a more or less great temperature dependence can be provided that depends upon the forward voltage drop of the diode 21.

Figure 4:
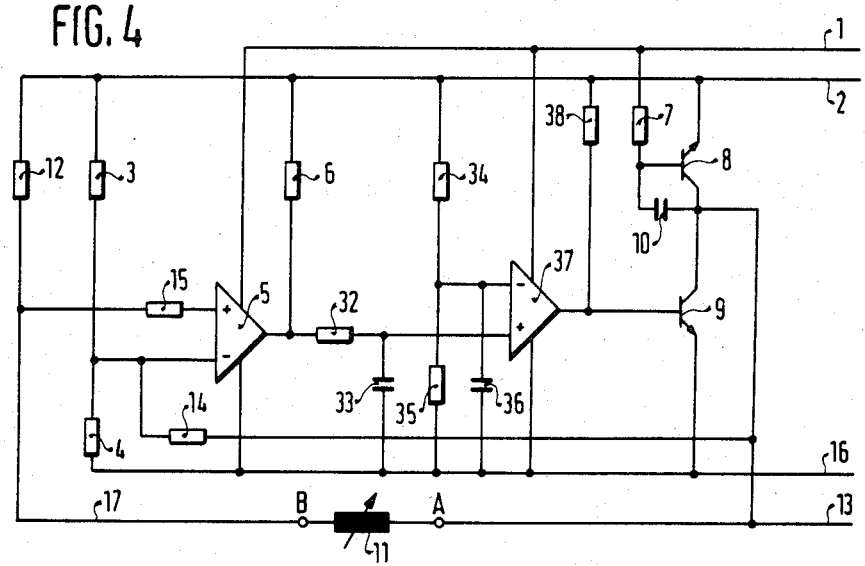
FIG. 4 is a circuit diagram of a fourth embodiment having an additive correction to the characteristic curve.

An additive shift of the characteristic curve of the circuit is possible in the case of the embodiment shown in FIG. 4. Whereas a predominantly multiplicative shift of the characteristic curve can be obtained simply by offsetting of the comparator threshold value of the inverting input of the amplifier 5, an additive shift of the characteristic curve that is often necessary is not possible in that simple way.

Figure 5:
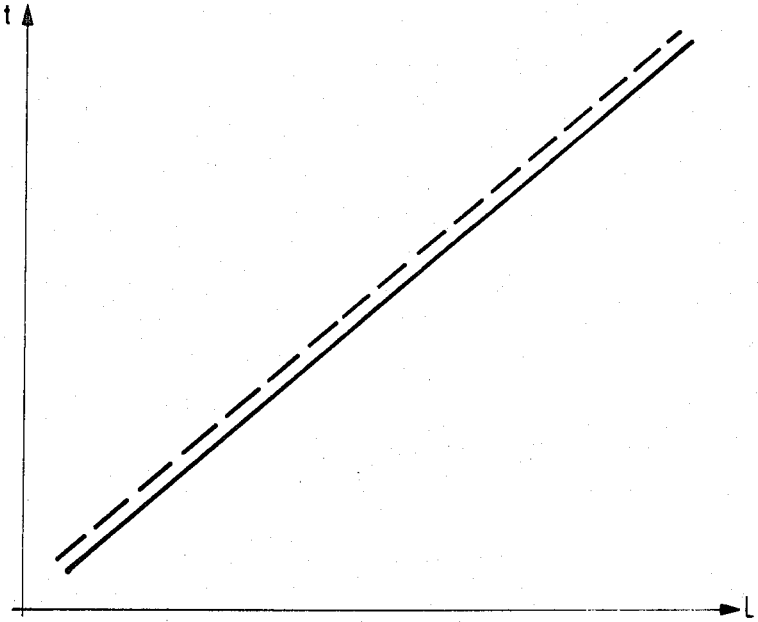
FIG. 5 is a graph for explaining the operation of the circuit of FIG. 4.

FIG. 5 shows by way of example the diagram of the output signal, where the inductance L of the inductor 11 is plotted on the abscissa, while the period duration T is indicated as ordinate. The solid line on the graph is the characteristic curve of a circuit according to FIG. 1, while the broken line is a characteristic curve such as can be obtained in an otherwise similar arrangement with a circuit according to FIG. 4.

In FIG. 4 the battery voltage line 1 serves for the voltage supply of the amplifiers 5 and 37. The resistance 3 is again connected to the voltage line 2 and connected in series with the resistor 4 which leads to the ground line 16. The negative voltage supply of the amplifier 5 and of the amplifier 37 is connected to the ground line 16.

The voltage tap between the resistors 3 and 4 is connected to the inverting input of the amplifier 5. The output of this voltage amplifier is connected on the one hand through a resistor 6 with the voltage line 2 and on the other hand through a resistor 32 to the noninverting input of the amplifier 37. A capacitor 33 is connected between the noninverting input of the amplifier 37 and the ground line 16.

A voltage divider with the resistances 34 and 35 is connected between the voltage line 2 and the ground line 16 to provide an intermediate voltage tap for connection to the inverting input of the amplifier 37. A capacitor 36 for suppression of disturbing pulses at the inverting input of the amplifier 37 is connected between that input and the common ground line. The output of the amplifier 37 is connected on one hand through a resistor 38 with the voltage line 2 and on the other hand to the base of the transistor 9. The emitter of the transistor 9 is connected to the ground line 16, while its collector is connected to the collector of the transistor 8. The base of the transistor 8 is connected through a resistor 7 with the battery voltage line 1. The capacitor 10 is connected between the base and the collector on this transistor 8. The emitter of the transistor 8 is connected to the voltage line 2. The collectors of transistors 8 and 9 are connected on the one hand to the terminal A and on the other hand to an output line 13 and, furthermore, over a resistor 14 to the inverting input of the amplifier 5. The variable inductance 11 is again connected between the terminals A and B. A resistor 12 is connected between the terminal B and the voltage line 2. The feedback line 17 is connected between the terminal B and the resistor 15 through which a connection is made to the noninverting input of the amplifier 5.

The operation of this circuit corresponds also to that of the circuit of FIG. 1 so far as concerns behavior under short-circuit. A prolongation of the period of duration of the signal is however produced by the delay circuit. When the transistor 9 is blocked, the voltage at the terminal A jumps high and is limited to the voltage of the voltage line 2 by the transistor 8 which becomes conducting. The current in the circuit containing the resistor 12 and the inductance 11 falls off slowly, while the voltage at the noninverting input of the amplifier 5 slowly rises. When the latter voltage is the same as the comparison voltage at the inverting input, the amplifier 5 switches over at its output. An exponentially rising voltage is produced at the noninverting input of the amplifier 37 as a result of the resister 32 in series with the resistor 6 and the capacitor 33. When this rising voltage oversteps the voltage produced by the voltage divider composed of the resistors 34 and 35, the amplifier 37 connected as a comparator blocks and the transistor 9 is turned on into its conducting condition through the resistor 38, which in turn blocks the transistor 8. The terminal A now lies again at zero volts and the current in the circuit branch composed of the resistor 12 and the inductance 11 rises exponentially. In consequence a new low voltage is produced at the inverting input of the amplifier 5 through the resistor 14. The voltage at the noninverting input of the amplifier 5 falls off corresponding to the current, until it is equal to the voltage at the inverting input and the amplifier 5, which is connected as a comparator, switches over and provides a ground voltage connection at the output. The charge stored in the capacitor 33 now flows essentially through the resistor 32 to ground, so that after a corresponding delay time after the switching of the amplifier 37 the transistor 9 is again blocked and the cycle begins anew. The amplifier 37 blocks as soon as the voltage at the noninverting input goes below the voltage at the inverting input of the amplifier 37.

An example for the additive shift of the characteristic curve thus obtainable is illustrated in FIG. 5, where the broken line shows the curve for a circuit in which the delay network 32, 33 is switched in. It will be recognized that the period length of the circuit has become greater, so that thereby an additive adjustment for the characteristic curve is possible. This is particularly advantageous if it is necessary to replace the inductance 11 so that a new calibration is necessary. By a change of the resistance 32 or of the capacitor 33 it is possible to obtain an additive shift of the characteristic curve within a wide range.

Although the invention has been described with reference to particular illustrative embodiments, it will be understood that variations and modifications are possible within the inventive concept.

We claim:

1. An electric circuit for a variable inductor of an inductive transducer for measuring mechanical displacement, said circuit comprising, in combination with first and second voltage supply lines, said first voltage supply line being at a higher potential than said second voltage supply line:
   an amplifier (5);
   a final stage including a delay network comprising said inductor (11) and a first resistance (12) connected between a first terminal (B) of said inductor and said second voltage supply line (2), said final stage also including a first transistor (9) having one of its two switching path electrodes grounded and its other switching path electrode connected to a second terminal (A) of said inductor, and having its base connected to the output of said amplifier, said switching path electrodes being the emitter and collector of said first transistor, said delay network having a feedback connection output (17, 15; 25) connected between said first terminal (B) of said inductor and an input of said amplifier (5) for producing and timing the cycle period of oscillations of a system including said amplifier (5) and said final stage, said oscillations producing an output signal available at said second terminal (A) of said inductor; and
   a second transistor (8) having its base electrode connected to said first voltage supply line (1) through a second resistance (7) and having its collector-emitter path interposed between said second voltage supply line (2) and said second terminal (A) of said inductor in such a sense that said second transistor (8) conducts when said first transistor (9) is blocked and said second transistor is automatically blocked when said second terminal (A) of said inductor is at a potential near ground potential, the voltage difference between the respective voltages of said first and second voltage supply line being limited to the maximum permissible base to emitter voltage of said second transistor (8).

2. A circuit as defined in claim 1 in which, for accelerating the switching of said second transistor into its blocked condition, a capacitor (10) is connected between the base and the electrode of said second transistor (8) which is connected to said final stage.

3. A circuit as defined in claim 1 or 2 in which there is provided a second amplifier (18), the output of which is connected to the base of said second transistor (8) and the control input of which is connected for at least one polarity of conduction, to said first terminal (B) of said inductor (11).

4. A circuit as defined in claim 1 or 2 in which a first diode (24) is connected between one input of said amplifier (5) and said second voltage supply line (2) for limiting said input to a maximum voltage equal to that of said second voltage supply line and a second diode (21) is interposed between another input of said amplifier (5) and said first terminal (B) of said inductor.

5. A circuit as defined in claim 1 or 2 in which a resistance (22) is interposed between the output electrode of said first transistor (9) and the circuit output, for decoupling purposes, and a diode (23) is connected between the circuit output thereby provided and said second voltage supply line (2).

6. A circuit as defined in claim 3 in which a lowpass filter (26, 27) is connected between said first terminal (B) of said inductor (11) and the control input of said second amplifier.

7. A circuit as defined in claim 6 in which one input of said first mentioned amplifier (5) is connected through a diode to the output of said second amplifier (18).

8. A circuit as defined in claim 1 or 2 in which a second delay network (32, 33) is interposed in the amplifying path which contains said first mentioned amplifier and said final stage for lengthening the oscillation cycle period of said circuit.

9. A circuit as defined in claim 8 in which said second delay network comprises a resistance-capacitor network (32, 33) and an amplifying comparator (37) having an input connected to the output of said resistor-capacitor network.

10. A circuit as defined in claim 8 in which said second delay network is interposed between the output of said first mentioned amplifier (5) and the base electrode of said transistor (9) of said final stage.

* * * * *